United States Patent
Lai et al.

(10) Patent No.: US 10,964,245 B2
(45) Date of Patent: Mar. 30, 2021

(54) SHIFT REGISTER CIRCUIT AND GATE DRIVER

(71) Applicant: AU Optronics Corporation, Hsin-Chu (TW)

(72) Inventors: Po-Cheng Lai, Hsin-Chu (TW); Mao-Hsun Cheng, Hsin-Chu (TW); Cheng-Han Huang, Hsin-Chu (TW); Yung-Chih Chen, Hsin-Chu (TW); Ching-Sheng Cheng, Hsin-Chu (TW); Chih-Lung Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/653,459

(22) Filed: Oct. 15, 2019

(65) Prior Publication Data
US 2020/0294436 A1    Sep. 17, 2020

(30) Foreign Application Priority Data

Mar. 11, 2019 (TW) .................................. 108108090

(51) Int. Cl.
| | | |
|---|---|---|
| G11C 19/00 | (2006.01) |
| G09G 3/20 | (2006.01) |
| G11C 19/28 | (2006.01) |
| G09G 3/36 | (2006.01) |

(52) U.S. Cl.
CPC ............. *G09G 3/20* (2013.01); *G09G 3/3677* (2013.01); *G11C 19/28* (2013.01); *G11C 19/287* (2013.01); *G09G 2310/0267* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2004/0056828 A1 | 3/2004 | Choi et al. |
| 2007/0296672 A1 | 12/2007 | Kim et al. |
| 2010/0110050 A1* | 5/2010 | Park ..................... G09G 3/3266 |
| | | | 345/205 |
| 2012/0050350 A1 | 3/2012 | Matsui |
| 2012/0169703 A1 | 7/2012 | Yang et al. |
| 2012/0212517 A1* | 8/2012 | Ahn ..................... G09G 3/3266 |
| | | | 345/690 |
| 2013/0222352 A1* | 8/2013 | Jeong .................... G11C 19/28 |
| | | | 345/205 |

(Continued)

FOREIGN PATENT DOCUMENTS

CN          103500550          1/2014

*Primary Examiner* — Tuan T Lam
(74) *Attorney, Agent, or Firm* — WPAT, PC (57) ABSTRACT

A shift register circuit and a gate driver including the shift register circuit. The shift register circuit includes an input circuit, a drive circuit, a pull-down circuit, a regulator circuit and a pull-up circuit. The input circuit is configured to receive a first clock signal and is coupled to the first node. The driving circuit is configured to receive the first clock signal and a second clock signal. The input circuit is coupled to the first node. The pull-down circuit is configured to receive the voltage of the first node. The pull-down circuit is coupled to the first node and an output terminal. The pull-down circuit outputs the first voltage to the output terminal in response to the voltage of the first node.

13 Claims, 9 Drawing Sheets

(56) References Cited

U.S. PATENT DOCUMENTS

| | | |
|---|---|---|
| 2015/0294734 A1 | 10/2015 | Chan et al. |
| 2016/0133184 A1* | 5/2016 | Gupta .................. G09G 3/3233 345/690 |
| 2016/0213939 A1* | 7/2016 | Carney ................ A61N 1/3975 |
| 2016/0275845 A1* | 9/2016 | Tsai ...................... G09G 3/3266 |
| 2016/0379558 A1* | 12/2016 | Jeon ..................... G09G 3/3266 345/213 |
| 2017/0124950 A1 | 5/2017 | Choi |
| 2017/0365211 A1* | 12/2017 | Lee ...................... G09G 3/3233 |
| 2018/0130406 A1* | 5/2018 | Xiang .................. G09G 3/3208 |
| 2018/0315374 A1 | 11/2018 | Zhang et al. |

\* cited by examiner

SHIFT REGISTER CIRCUIT AND GATE DRIVER

RELATED APPLICATIONS

This application claims priority to Taiwan Application Serial Number 108108090, filed Mar. 11, 2019, which is herein incorporated by reference in its entirety.

BACKGROUND

Field of Invention

The present of the disclosure relates to a shift register and a gate driver. More particularly, the present disclosure relates to a shift register and a gate driver which can stably output a low voltage.

Description of Related Art

In a general display panel structure, a gate driver is composed of a plurality of shift registers, the gate driver is capable of outputting a stable signal when the gate driver is working. However, the circuit for controlling an output signal in a conventional shift register circuit lacks a design for stably controlling the driving voltage. Further, it affects the stability of the output signal and causes the output signal to be wrong. Therefore, it is necessary to design a shift register circuit which is capable of stably controlling a driving voltage.

SUMMARY

One aspect of the present disclosure is a shift register circuit. The shift register circuit includes an input circuit, a driving circuit and a pull down circuit. The input circuit is configured to receive a first clock signal and coupled to a first node of the shift register circuit, the input circuit outputs a first input signal to the first node in response to the first clock signal. The driving circuit is configured to receive the first clock signal and a second clock signal, and coupled to the first node, the driving circuit adjusts a first voltage of the first node in response to the first clock signal and the second clock signal. The pull-down circuit, is configured to receive the first voltage of the first node and coupled to an output terminal of the shift register circuit, the pull-down circuit outputs the first voltage to the output terminal in response to the first voltage of the first node.

Another aspect of the present disclosure is a gate driver including a plurality of shift registers. The plurality of shift registers are connected in series with each other. A first shift register circuit of the plurality of shift register circuits is configured to receive a first clock signal and a second clock signal, the first shift register circuit adjusts a voltage of a first node of the first shift register circuit in response to the first clock signal and the second clock signal, the first shift register circuit outputs a first voltage in response to the voltage of the first node. A second shift register circuit of the plurality of shift register circuits is configured to receive a third clock signal and a fourth clock signal, wherein the second shift register circuit adjusts a voltage of a second node of the second shift register circuit in response to the third clock signal and the fourth clock signal, the second shift register circuit outputs a second voltage in response to the voltage of the second node. The first clock signal and the third clock signal are inverted each other, the second clock signal and the fourth clock signal respectively generate a pulse signal during different periods.

DETAILED DESCRIPTION

It will be understood that, in the description herein and throughout the claims that follow, the terms "comprise" or "comprising," "include" or "including," "have" or "having," "contain" or "containing" and the like used herein are to be understood to be open-ended, i.e., to mean including but not limited to.

It will be understood that, in the description herein and throughout the claims that follow, the terms "coupled", "electrically coupled", "electrically connect" may indicate that two or more components being directly physically contacted or electrically contacted with each other, or indirectly physically contacted or electrically contacted with each other. That is, intervening elements may be present. Moreover, "electrically connect" or "connect" may further refer to the interoperation or interaction between two or more elements.

Figure 1:
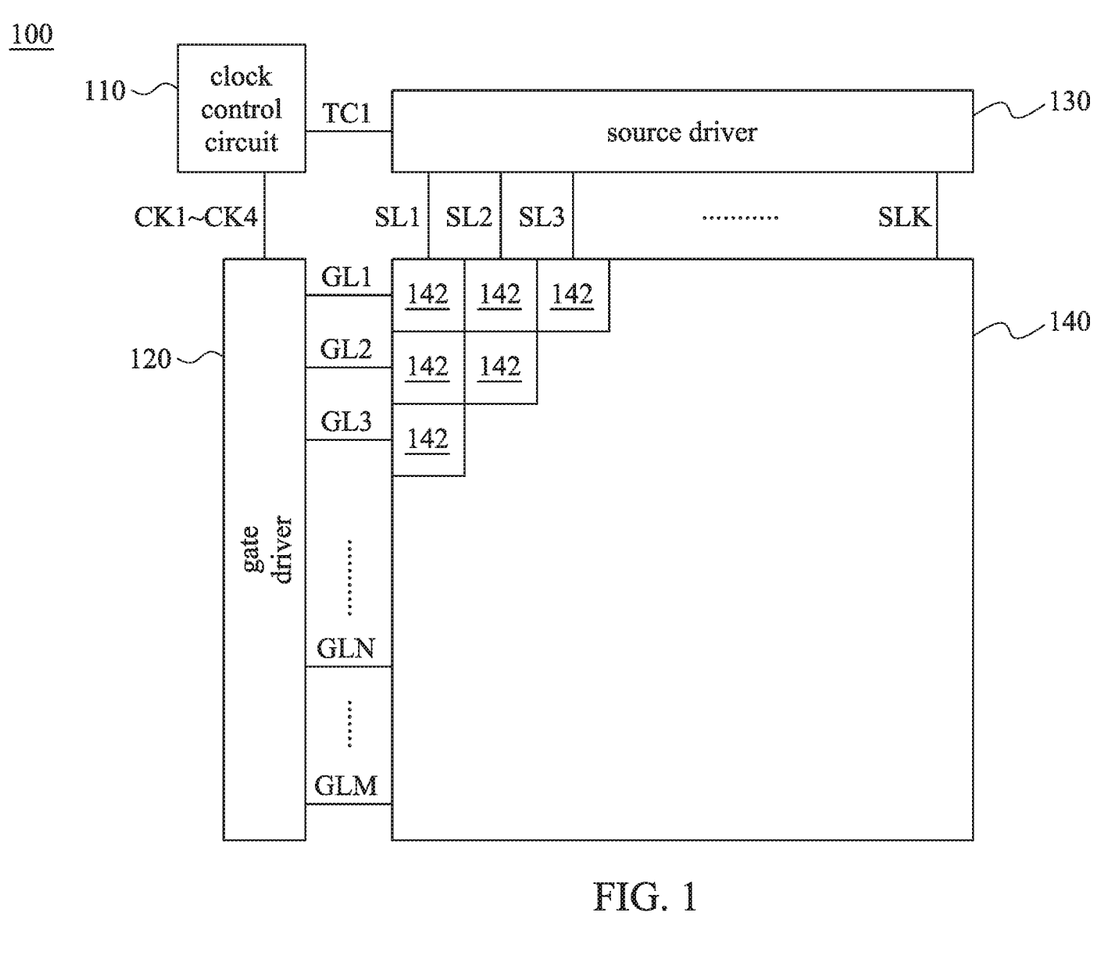
FIG. 1 is a schematic diagram of a display panel according to an embodiment of the present disclosure.

Referring to FIG. 1, FIG. 1 is a schematic diagram of a display panel according to an embodiment of the present disclosure. As shown in FIG. 1, a display panel 100 includes a clock control circuit 110, a gate driver 120, a source driver 130 and an image display area 140. The image display area 140 is formed by a plurality of scanning lines GL1-GLN and a plurality of data lines SL1-SLN, and the image display area 140 includes a plurality of display pixels 142. Here, the number of N is taken as an example, and the number of N can be adjusted according to the panel size of the actual application. The clock control circuit 110 is coupled to the gate driver 120 and the source driver 130 and transmits a clock control signal to control the clock of the operation of the source driver 130, and the clock signal CK1-CK4 control the gate driver 120. The gate driver 120 outputs a gate driving signal to the corresponding display pixel 142 via M scanning lines GL1-GLM. The source driver 130 outputs a source driving signal to the corresponding display pixel 142 via K scanning lines SL1-SLK. In an embodiment, the display panel 100 is a screen with a resolution of 1920× 1080, M is 1080, and K is 1920.

Figure 2:
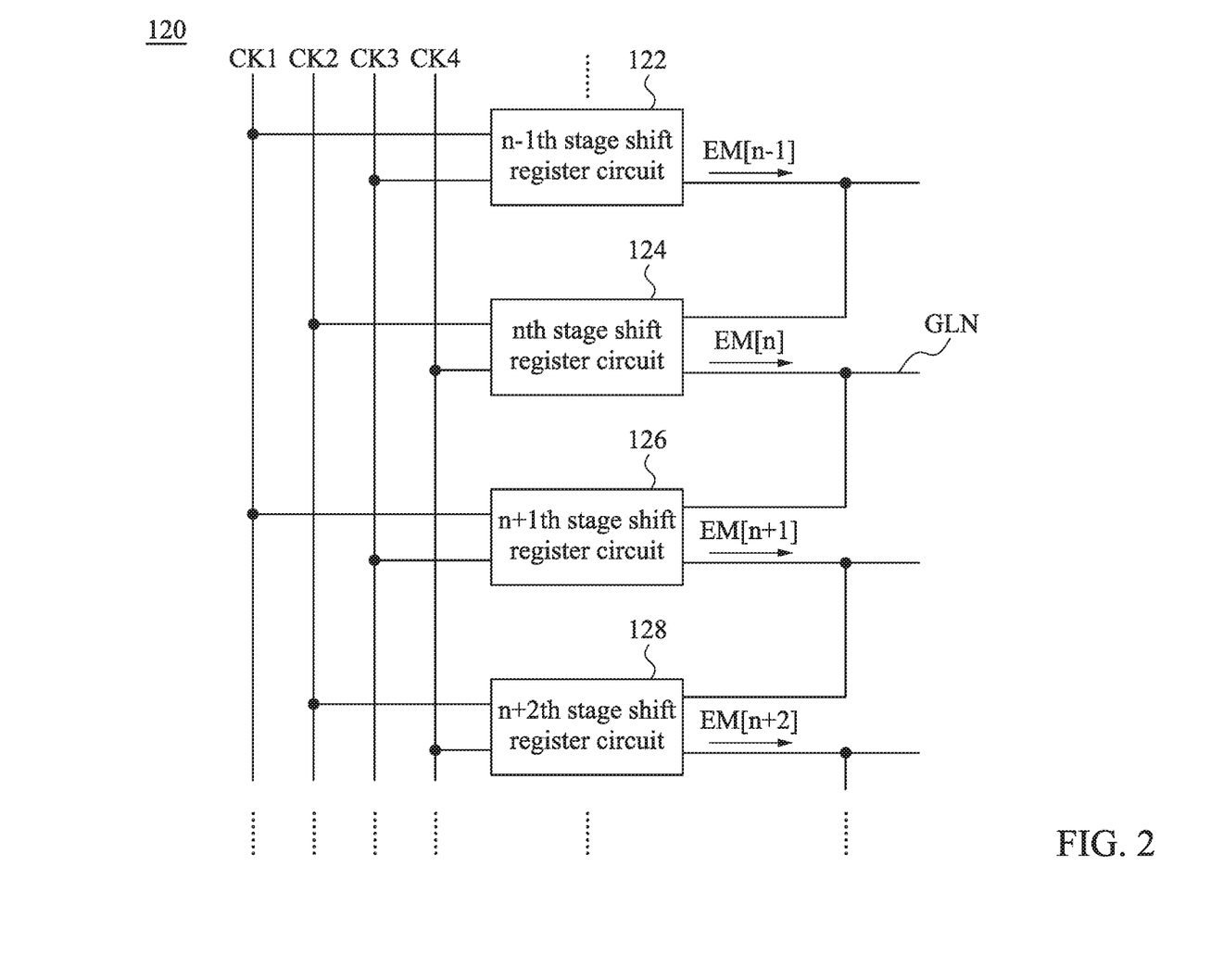
FIG. 2 is a function block diagram of a gate driver according to an embodiment of the present disclosure.

Referring to FIG. 2, FIG. 2 is a function block diagram of a gate driver according to an embodiment of the present disclosure. The gate driver 120 includes a plurality of shifter register circuits connected in series with each other. A nth stage shift register circuit 124 is configured to receive a clock signal CK2 and a clock signal CK4, a n−1th stage shift register circuit 122 which is the previous stage of the nth stage shift register circuit 124 or a n+1th stage shift register circuit 126 which is the next stage of the nth stage shift register circuit 124 are configured to receive a clock signal CK1 and a clock signal CK3, and so on. Namely, the clock signal CK1, the clock signal CK3 and the clock signal CK2, the clock signal CK4 are the two sets of clock signals which interlaced input to each stage of the shift register circuits, as shown in FIG. 2.

It should be noted that, for convenience, only the n−1th stage shift register circuit 122, the nth stage shift register circuit 124, the n+1th stage shift register circuit 126, and the n+2th stage shift register 128 are shown in FIG. 2, but the actual number of the shift registers is not limited to this. The n−1th stage shift register circuit 122 is configured to generate a output signal EM[n−1], the nth stage shift register circuit 124 is configured to generate a output signal EM[n], and so on. The output signals of each stage of the shift register circuits are outputted to the next stage shift registers, as shown in FIG. 2. Each stage of the shift register circuit uses the output signal of the previous stage as the input signal to achieve the effect of activating the next stage by the current stage.

Figure 3:
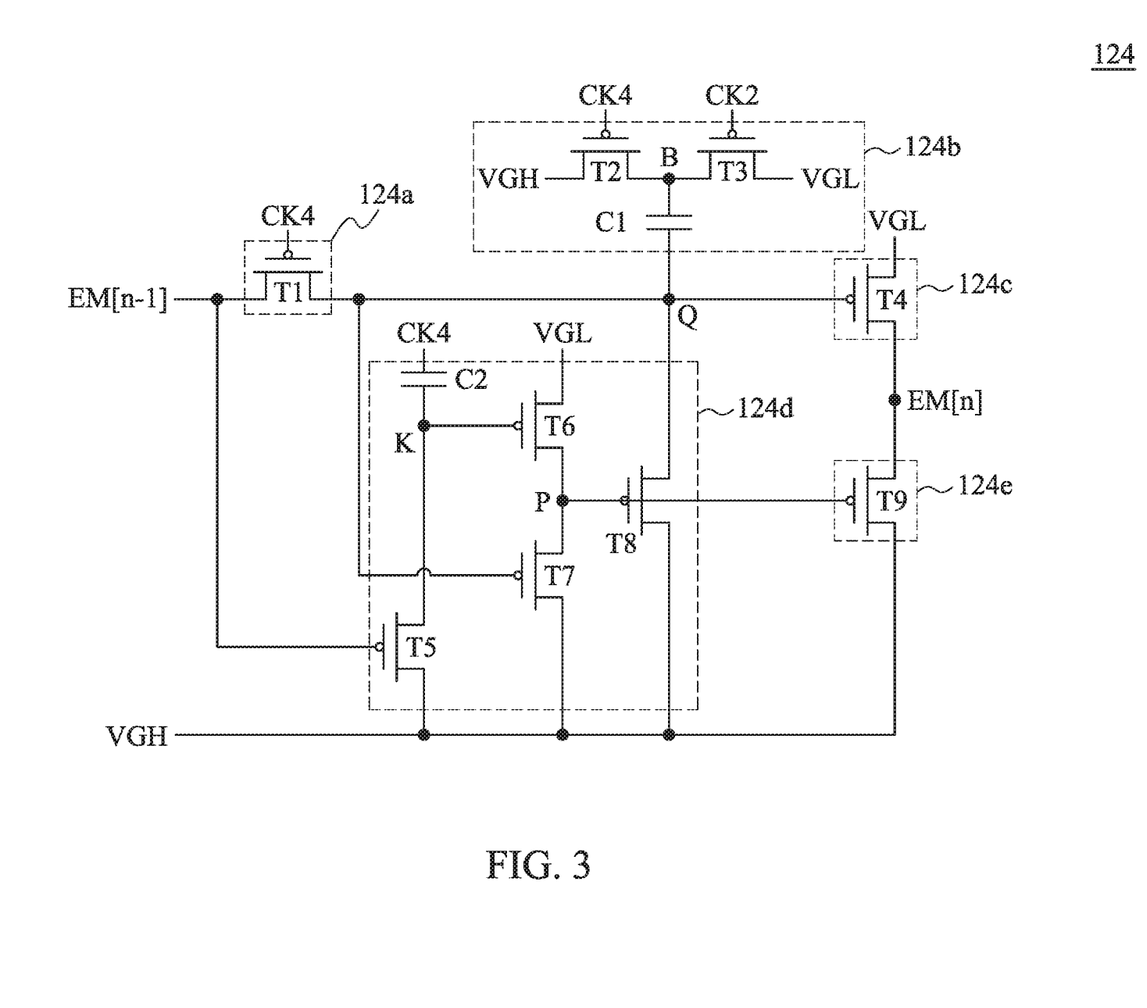
FIG. 3 is a circuit diagram of a shifter register circuit according to an embodiment of the present disclosure.

Referring to FIG. 3, FIG. 3 is a circuit diagram of a shifter register circuit according to an embodiment of the present disclosure. The nth stage shift register circuit 124 is taken as an example for description. The nth stage shift register circuit 124 includes an input circuit 124a, a driving circuit 124b, a pull-down circuit 124c, a regulator circuit 124d and a pull-up circuit 124e. In this embodiment, a voltage VGH means a high voltage, e.g., 5V, a voltage VGL means a low voltage, e.g., −4V, the following describes the structure and the operation of each circuit. In the n−1th stage shift register circuit 122 or the n+1th stage shift register circuit 126, the clock signal CK2 is replaced by the clock signal CK1, the clock signal CK4 is replaced by the clock signal CK3.

The input circuit 124a is configured to receive the clock signal CK4 and coupled to a node Q, the input circuit 124a outputs the output signal EM[n−1] to the node Q in response to the clock signal CK4. The output signal EM[n−1] is presented to a high voltage state and a low voltage state during different periods, therefore, the input circuit 124a outputs the voltage indicated by the output signal EM[n−1] to the node Q in response to the clock signal CK4. The input circuit 124a includes a transistor T1, the transistor T1 includes a first terminal, a second terminal and a control terminal. The first terminal of the transistor T1 is configured to receive the output signal EM[n−1], the second terminal of the transistor T1 is coupled to the node Q, the control terminal of the transistor T1 is configured to receive the clock signal CK4, and the transistor T1 is selectively conducted according to the clock signal CK4.

The driving circuit 124b is configured to receive the clock signal CK2 and the clock signal CK4, and coupled to the node Q. The driving circuit 124b controls or adjusts the voltage of the node Q in response to the clock signal CK2 and the clock signal CK4. In an embodiment, the driving circuit 124b includes a transistor T2, a transistor T3 and a capacitor C1. The transistor T2 and the transistor T3 include a first terminal, a second terminal and a control terminal. The first terminal of the transistor T2 is configured to receive the voltage VGH, the second terminal of the transistor T2 is coupled to a node B, the control terminal of the transistor T2 is configured to receive the clock signal CK4, and the transistor T2 is selectively conducted according to the clock signal CK4. The first terminal of the transistor T3 is coupled to the second terminal of the transistor T2 and the node B, the second terminal of the transistor T3 is configured to receive the voltage VGL, the control terminal of the transistor T3 is configured to receive the clock signal CK2, and the transistor T3 is selectively conducted according to the clock signal CK2. The capacitor C1 includes a first terminal and a second terminal, the first terminal of the capacitor C1 is coupled to the second terminal of the transistor T2, the first terminal of the transistor T3 and the node B, and the second terminal of the capacitor C1 is coupled to the node Q.

The pull-down circuit 124c is configured to receive the voltage of the node Q and coupled to the node Q and the output terminal, the pull-down circuit 124c outputs the voltage VGL to the output terminal in response to the voltage of the node Q. The pull-down circuit 124c includes a transistor T4, the transistor T4 includes a first terminal, a second terminal and a control terminal. The first terminal of the transistor T4 is configured to receive the voltage VGL, the second terminal of the transistor T4 is coupled to the output terminal, the control terminal of the transistor T4 is configured to receive the voltage of the node Q, and the transistor T4 is selectively conducted according to the voltage of the node Q.

The regulator circuit 124d is configured to receive the output signal EM[n−1] and the voltage of the node Q, and coupled to the node Q. The regulator circuit 124d controls the voltage of a node K in response to the output signal EM[n−1], controls the voltage of a node P in response to the voltage of the node Q, and outputs the voltage VGH to the node Q in response to the voltage of the node P. In an embodiment, the regulator circuit 124d includes a transistor T5—a transistor T8 and a capacitor C2, the transistor T5—the transistor T8 each include a first terminal, a second terminal and a control terminal. The first terminal of the transistor T5 is coupled to the node K, the second terminal of the transistor T5 is configured to receive the voltage VGH, the control terminal of the transistor T5 is configured to receive the output signal EM[n−1], and the transistor T5 is selectively conducted according to the output signal EM[n−1].

In addition, the first terminal of the transistor T6 is configured to receive the voltage VGL, the second terminal of the transistor T6 is coupled to the node P, the control terminal of the transistor T6 is coupled to the node K, and the transistor T6 is selectively conducted according to the voltage of the node K. The first terminal of the transistor T7 is coupled to the second terminal of the transistor T6, the second terminal of the transistor T7 is configured to receive the voltage VGH, the control terminal of the transistor T7 is coupled to the node Q, and the transistor T7 is selectively conducted according to the node Q. The first terminal of the transistor T8 is coupled to the node Q, the second terminal of the transistor T8 is configured to receive the voltage VGH, the control terminal of the transistor T8 is coupled to the node P, and the transistor T8 is selectively conducted according to the voltage of the node P. The capacitor C2 includes a first terminal and a second terminal, the first terminal of the capacitor C2 is configured to receive the clock signal CK4, and the second terminal of the capacitor C2 is coupled to node K.

The pull-up circuit 124e is configured to receive the voltage of the node P and coupled to output terminal, and the pull-up circuit 124e outputs the voltage VGH to the output terminal in response to the voltage of the node P. The pull-up circuit 124e includes a transistor T9, the transistor T9 includes a first terminal, a second terminal and a control terminal. The first terminal of the transistor T9 is coupled to the output terminal, the second terminal of the transistor T9 is configured to receive voltage VGH, the control terminal of the transistor T9 is coupled to the node P, and the transistor T9 is selectively conducted according to the voltage of the node P.

Figure 4:
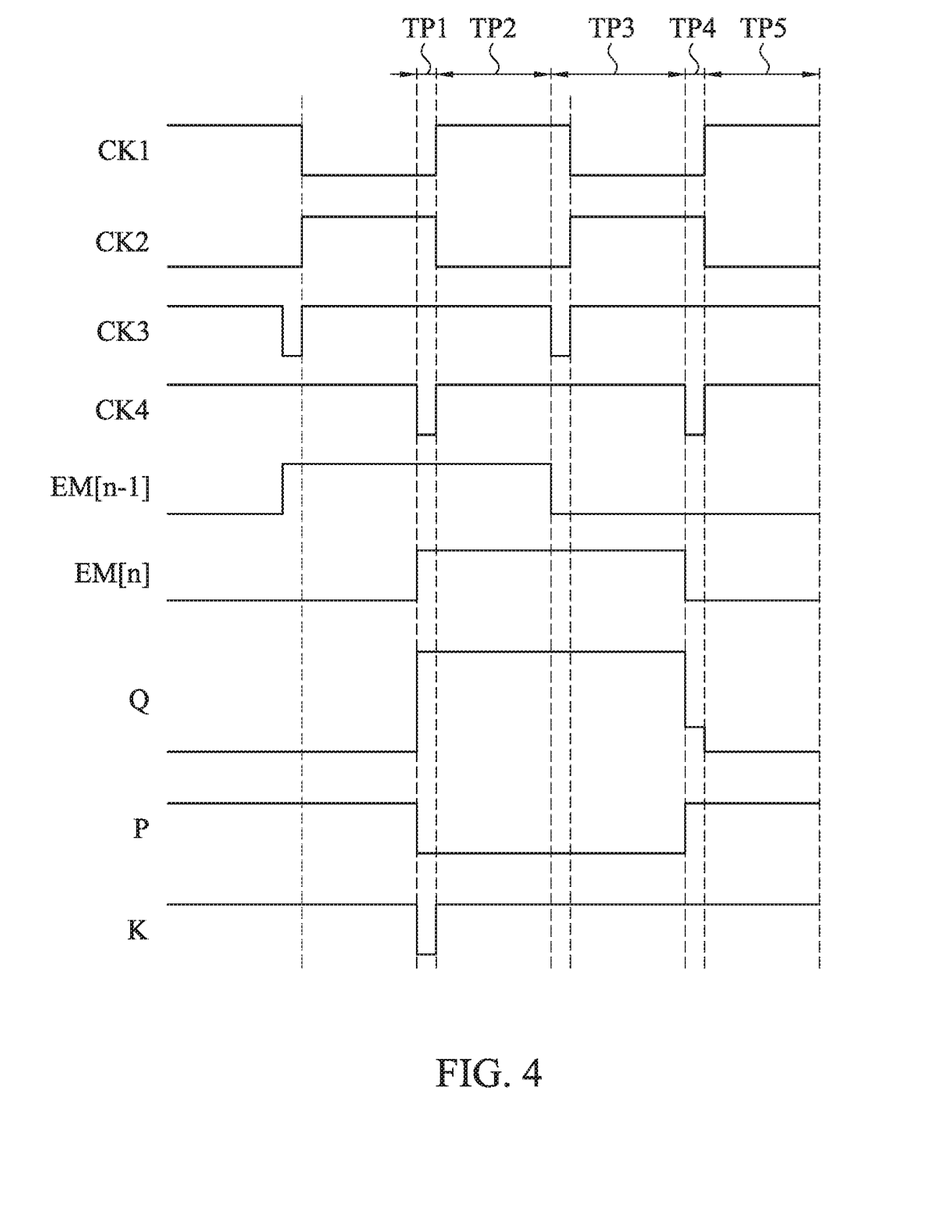
FIG. 4 is a signal timing diagram corresponding to the shifter register circuit of FIG. 3.

Referring to FIG. 4, FIG. 4 is a signal timing diagram corresponding to the shifter register circuit of FIG. 3. FIG. 4 includes the signal timings of the clock signal CK1—the clock signal CK4, the output signal EM[n−1], the output signal EM[n], the node Q, the node P and the node K. As shown in FIG. 4, the nth stage shifter register circuit 124 operates in an input period TP1, a pull-up period TP2, a maintaining period TP3, a pull-down period TP4 and a stabilizing period TP5. The operation of the nth stage shift register circuit 124 in each period interval will be described in detail below.

Figure 5:
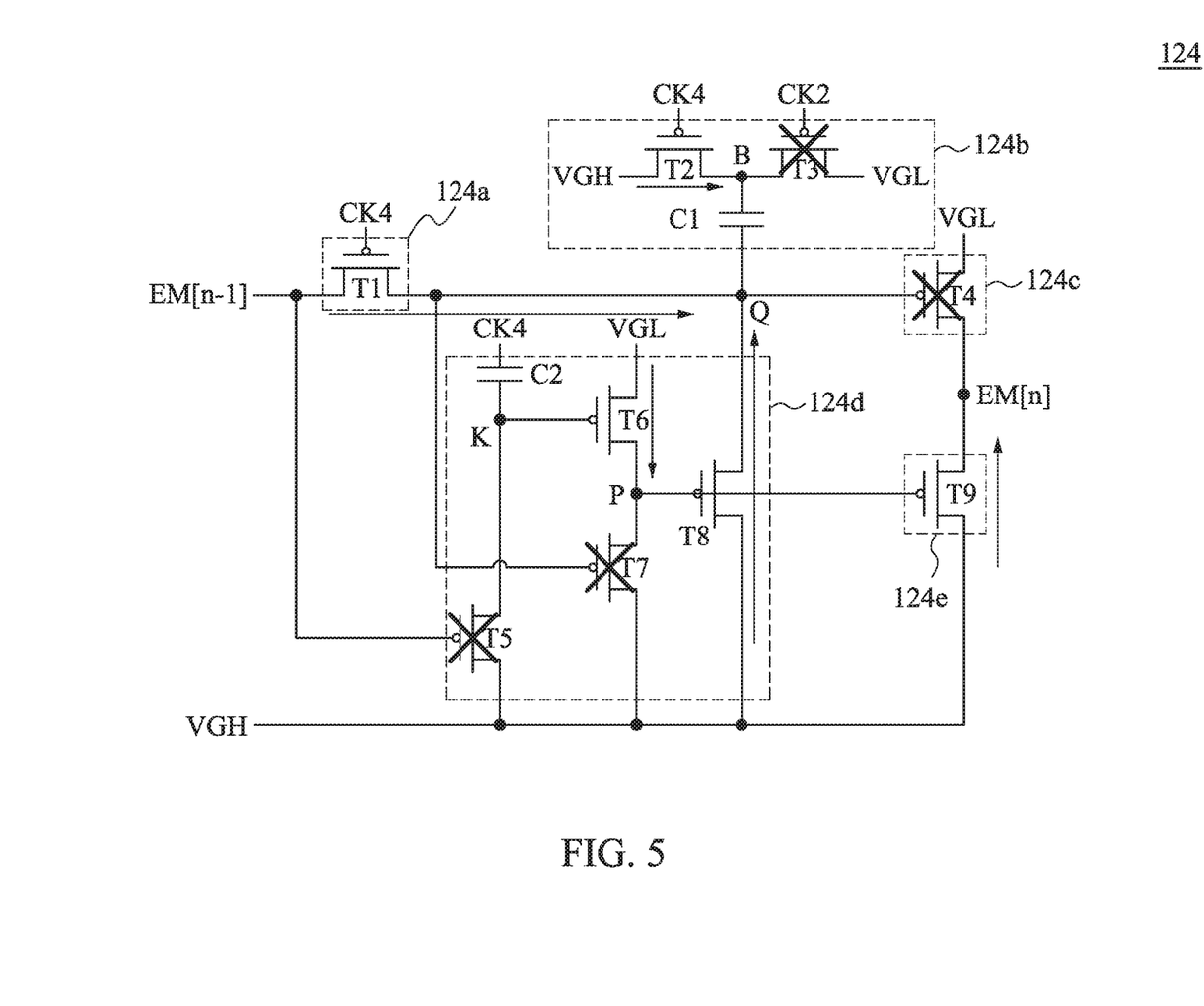
FIG. 5 is a schematic diagram of a shifter register circuit in an input period according to an embodiment of the present disclosure.

Referring to FIG. 4 and FIG. 5, FIG. 5 is a schematic diagram of a shifter register circuit in an input period according to an embodiment of the present disclosure. In the input period TP1, the clock signal CK2 is a high level, the clock signal CK4 is a low level, the previous stage output signal EM[n−1] is the voltage VGH. The clock signal CK4 is the low level such that the transistor T1 and the transistor T2 are conducted, the transistor T1 is conducted to output the high level of the output signal EM[n−1] to the node Q, the transistor T2 is conducted to output the voltage VGH to the node B to charge the capacitor C1, and the voltage of node Q is changed to the voltage VGH. The low level of the clock signal CK4 is charged to the capacitor C2 such that the node K is changed to the low level to conduct the transistor T6 to output the voltage VGL to the node P. The high level of the node Q causes the transistor T7 to turn off, at this time, the voltage VGL is supplied to node P via the transistor T6, and the voltage of the node P is changed to the low level such that the transistor T8 and the transistor T9 are conducted. The high level of the node Q causes the transistor T4 to turn off, the transistor T9 is conducted such that the voltage VGH is outputted to the output terminal, the output signal EM[n] is the voltage VGH.

Figure 6:
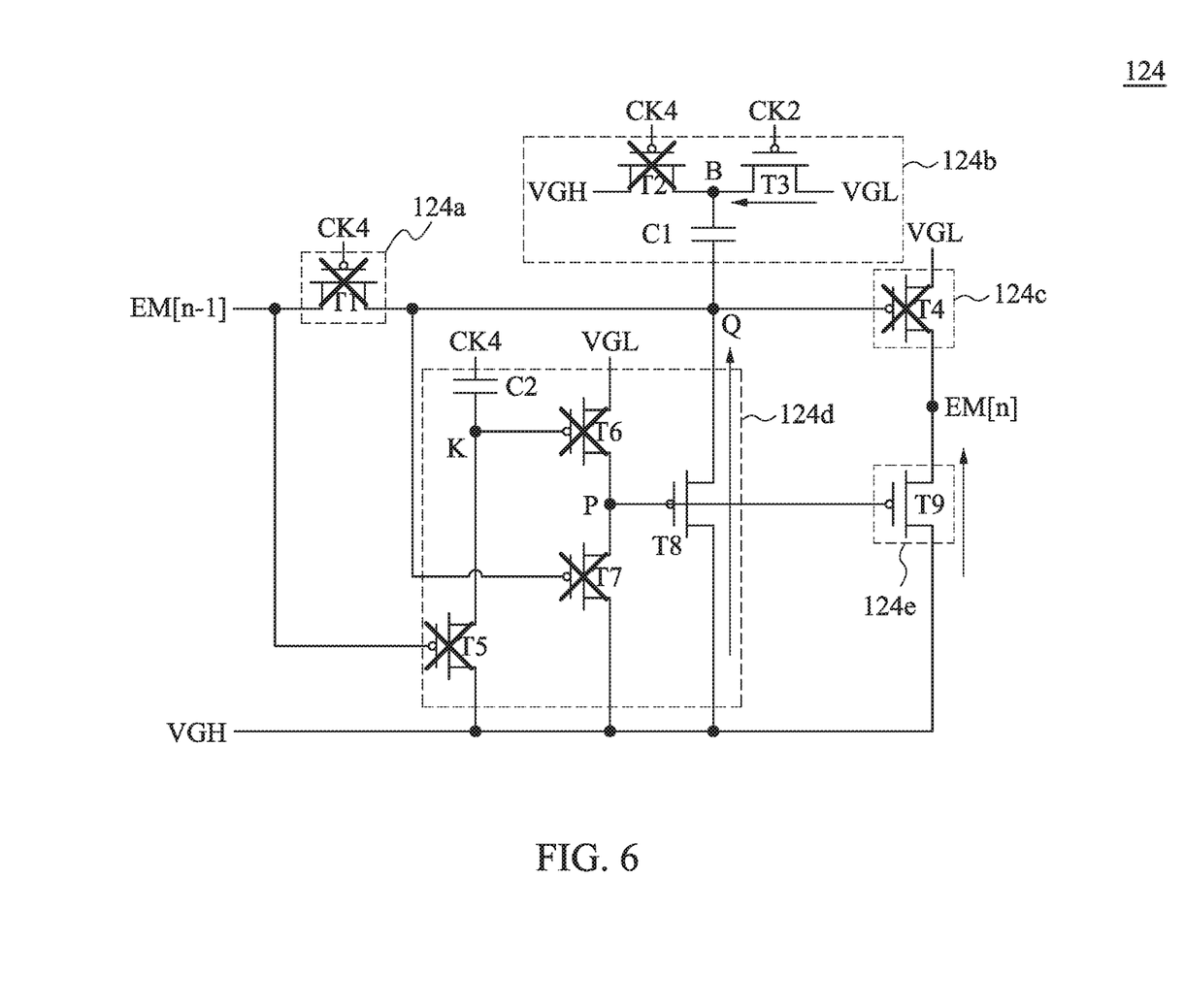
FIG. 6 is a schematic diagram of a shifter register circuit in a pull-up period according to an embodiment of the present disclosure.

Referring to FIG. 4 and FIG. 6, FIG. 6 is a schematic diagram of a shifter register circuit in a pull-up period according to an embodiment of the present disclosure. In the pull-up period TP2, the clock signal CK2 is a low level, the clock signal CK4 is a high level, and the previous stage output signal EM[n−1] is the voltage VGH. The clock signal CK4 is the high level such that the transistor T1, the transistor T2 and the transistor T6 are turned off. The voltage of the node P is maintained at the low level for a period of time due to a parasitic capacitance, it causes the transistor T8 and the transistor T9 to be conducted such that the voltage VGH is outputted to the node Q, the node Q is changed to the high level, and the transistor T4 is turned off. The transistor T9 is conducted to output the voltage VGH to the output terminal such that the output signal EM[n] is changed to the voltage VGH.

Figure 7:
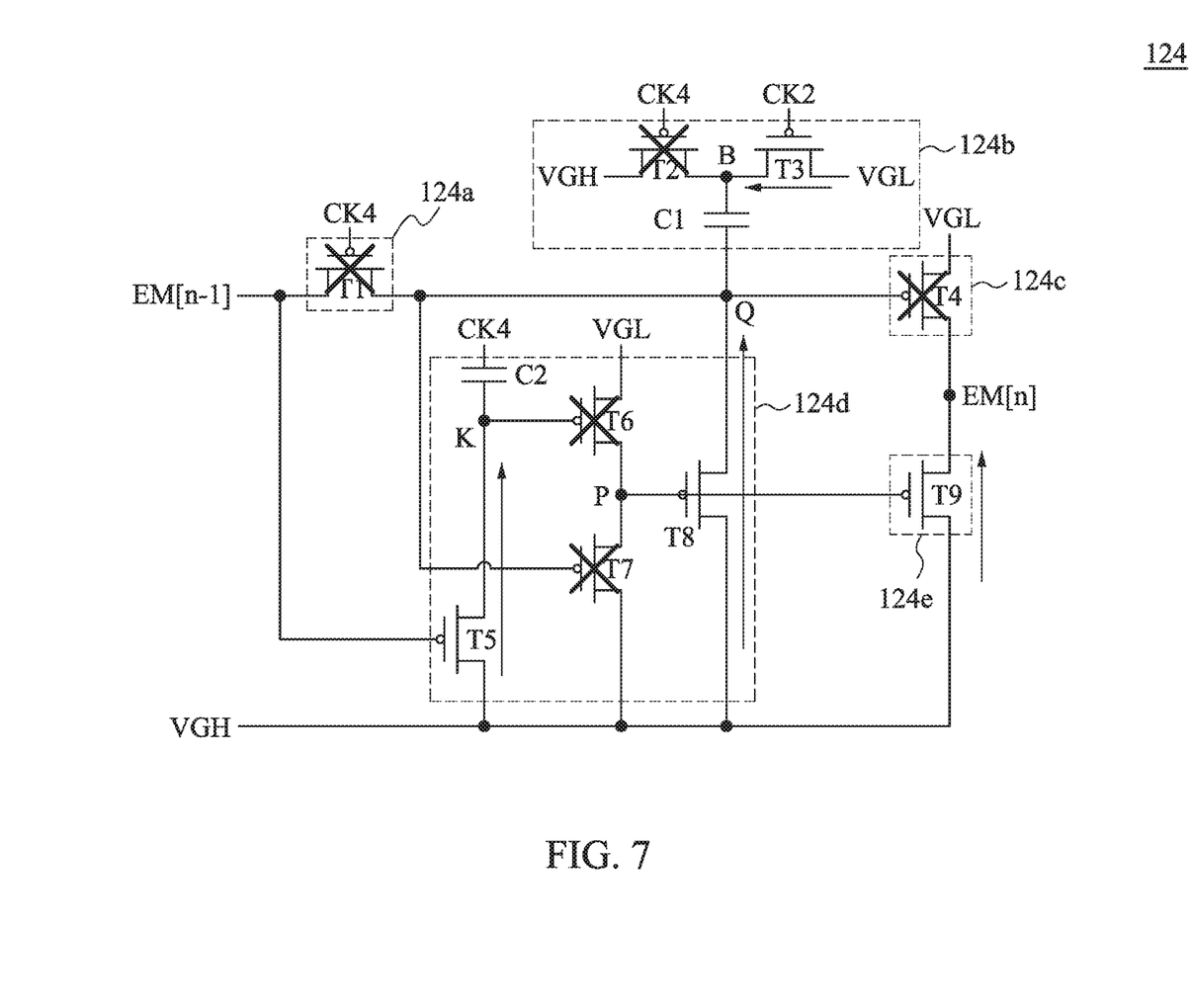
FIG. 7 is a schematic diagram of a shifter register circuit in a maintaining period according to an embodiment of the present disclosure.

Referring to FIG. 4 and FIG. 7, FIG. 7 is a schematic diagram of a shifter register circuit in a maintaining period according to an embodiment of the present disclosure. In the maintaining period TP3, the clock signal CK2 is changed from a low level to a high level, the clock signal CK4 is the high level, and the previous stage output signal EM[n−1] is the voltage VGL. The transistor T5 is conducted such that the node K is changed to the high level and the transistor T6 is turned off. The node P is maintained at the low level to conduct the transistor T8 such that the voltage of the node Q is maintained at the high level, and the high level of the node Q turns off the transistor T4. The transistor T9 is conducted to output the voltage VGH to the output terminal such that the output signal EM[n−1] is maintained at the voltage VGH.

Figure 8:
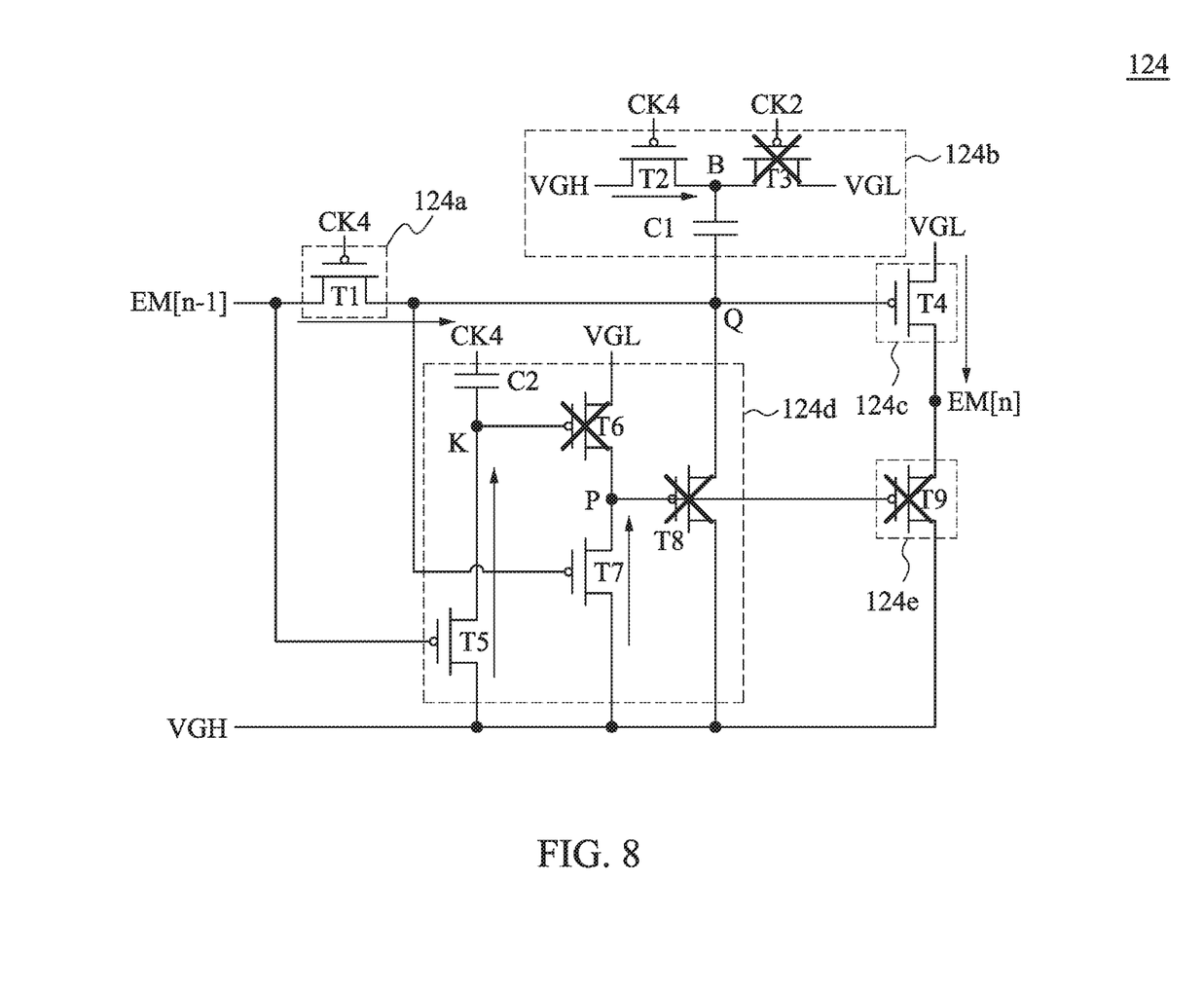
FIG. 8 is a schematic diagram of a shifter register circuit in a pull-down period according to an embodiment of the present disclosure.

Referring to FIG. 4 and FIG. 8, FIG. 8 is a schematic diagram of a shifter register circuit in a pull-down period according to an embodiment of the present disclosure. In the pull-down period TP4, the clock signal is a high level, the clock signal is a low level, and the previous stage output signal EM[n−1] is the voltage VGL. The transistor T1 is conducted to output the output signal EM[n−1] to the node Q, at this time, the voltage of the node Q is the voltage VGL plus a threshold voltage VTH1 of the transistor T1. Since the output terminal is located at the second terminal of the transistor T4, the voltage of the output signal EM[n] is affected by the control terminal of the transistor T4. The output signal EM[n] is based on the voltage of the node Q which is coupled to the control terminal of the transistor T4. At this time, the transistor T4 is in the saturation region, the voltage of the node Q is the voltage VGL plus the threshold voltage VTH1 of the transistor T1. The output signal EM[n] is discharged from the voltage VGH until the output signal EM[n] becomes a voltage that is different from the voltage of the node Q by the threshold voltage TH4 of the transistor T4. The transistor T4 is changed to a cut-off state, and the voltage of the output signal EM[n] is the sum of the voltage VGL, the threshold voltage VTH1, and the threshold voltage VTH4, and that is also the lowest voltage the output signal EM[n] can output.

Figure 9:
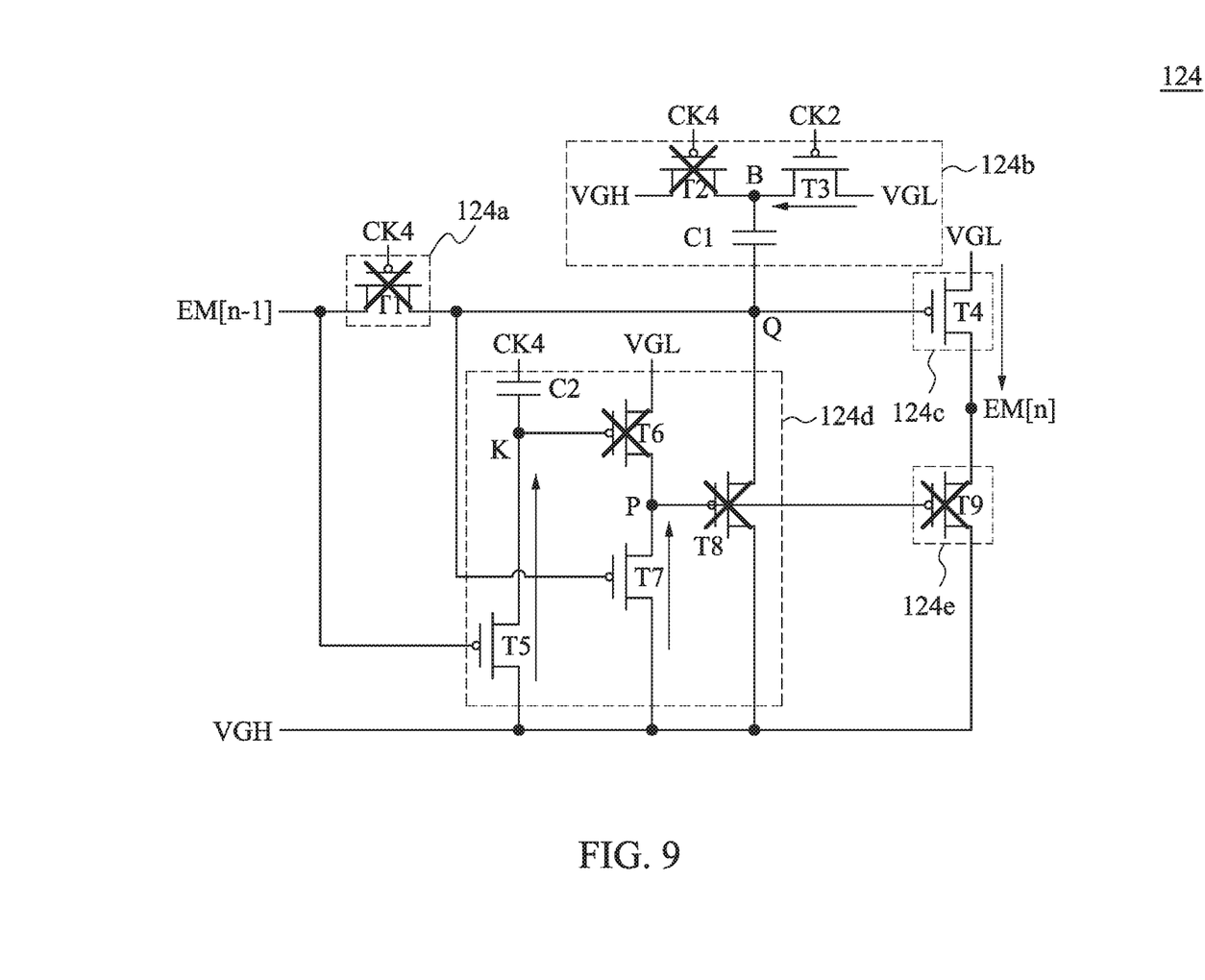
FIG. 9 is a schematic diagram of a shifter register circuit in a stabilizing period according to an embodiment of the present disclosure.

Referring to FIG. 4 and FIG. 9, FIG. 9 is a schematic diagram of a shifter register circuit in a stabilizing period according to an embodiment of the present disclosure. In the stabilizing period TP5, the clock signal CK2 is a low level, the clock signal CK4 is a high level, and the previous stage output signal EM[n−1] is the voltage VGL. At this time, the voltage of the node B is changed from the voltage VGH of the previous stage to the voltage VGL, since the node Q is in a floating state, the voltage of the node Q is lowered by a voltage ΔV due to the coupling of the capacitor C1, and the voltage of the node Q becomes the voltage VGL plus the threshold voltage VTH1 minus the voltage ΔV. The node Q can be lowered to a voltage which is lower than the voltage VGL, and the transistor T4 is changed to the linear region, therefore, the voltage of the output signal EM[n] can be completely discharged to the voltage VGL to achieve the effect of stably outputting the voltage VGL.

In summary, by periodically coupling the node Q to a voltage which is lower than the low voltage, the output signal can output a low voltage stably and continuously such that the subsequent circuit can operate stably to avoid outputting an erroneous signal.

Those skilled in the art will appreciate that in various embodiments, the various circuit elements can be implemented by various types of digital or analog circuits, or can be respectively implemented by different integrated circuit chips. Individual components can also be integrated into a single integrated circuit. The above is an example, and the present disclosure is not limited thereto. Electronic components such as resistors, capacitors, diodes, transistor switches, and the like can be made of various suitable components. For example, according to the requirements, the transistors T1~T9 can be implemented by metal-oxide-semiconductor field-effect transistor (MOSFET), bipolar junction transistor (BJT) or other various types of transistor.

The present disclosure has been disclosed in the above embodiments, and is not intended to limit the disclosure. Anyone skilled in the art can make various changes and refinements without departing from the spirit and scope of the present disclosure. The scope of protection of the content is subject to the definition of the scope of the patent application. Therefore, the scope of protection of the present disclosure is subject to the definition of the scope of the appended claims.

What is claimed is:

1. A shift register circuit, comprising:
an input circuit, configured to receive a first clock signal and coupled to a first node of the shift register circuit, wherein the input circuit outputs a first input signal to the first node in response to the first clock signal;
a driving circuit, configured to receive the first clock signal and a second clock signal, and coupled to the first node, wherein the driving circuit adjusts a first voltage of the first node in response to the first clock signal and the second clock signal; and
a pull-down circuit, configured to receive the first voltage of the first node and coupled to an output terminal of the shift register circuit, wherein the pull-down circuit outputs the first voltage to the output terminal in response to the first voltage of the first node;
a voltage regulator circuit, configured to receive the first voltage, and comprising:
a first transistor, wherein the first transistor comprises a first terminal, a second terminal and a control terminal, the first terminal of the first transistor is coupled to a second node of the shift register circuit, the second terminal of the first transistor is configured to receive a second voltage, and the control terminal of the first transistor is configured to receive the first input signal, wherein the first transistor is selectively conducted according to the first input signal;
a second transistor, wherein the second transistor comprises a first terminal, a second terminal and a control terminal, the first terminal of the second transistor is configured to receive the first voltage, the second terminal of the second transistor is coupled to a third node of the shift register circuit, and the control terminal of the second transistor is coupled to the second node, wherein the second transistor is selectively conducted according to a voltage of the second node;
a third transistor, wherein the third transistor comprises a first terminal, a second terminal and a control terminal, the first terminal of the third transistor is coupled to the second terminal of the second transistor, the second terminal of the third transistor is configured to receive the second voltage, and the control terminal of the third transistor is coupled to the first node, wherein the third transistor is selectively conducted according to the first voltage of the first node;
a fourth transistor, wherein the fourth transistor comprises a first terminal, a second terminal and a control terminal, the first terminal of the fourth transistor is coupled to the first node, the second terminal of the fourth transistor is configured to receive the second voltage, and the control terminal of the fourth transistor is coupled to the third node, wherein the fourth transistor is selectively conducted according to a voltage of the third node; and
a capacitor, wherein the capacitor comprises a first terminal and a second terminal, the first terminal of the capacitor is configured to receive the first clock signal, and the second terminal of the capacitor is coupled to the second node.

2. The shift register circuit of claim 1, wherein the voltage regulator circuit controls the voltage of the second node of the shift register circuit in response to the first input signal, controls the voltage of the third node in response to the first voltage of the first node, and outputs the second voltage to the first node in response to the voltage of the third node.

3. The shift register circuit of claim 1, further comprising:
a pull-up circuit, configured to receive the voltage of the third node, wherein the pull-up circuit outputs the second voltage to the output terminal in response to the voltage of the third node.

4. The shift register circuit of claim 3, wherein the pull-up circuit comprises:
a fifth transistor, wherein the fifth transistor comprises a first terminal, a second terminal and a control terminal, the first terminal of the fifth transistor is coupled to the output terminal, the second terminal of the fifth transistor is configured to receive the second voltage, and the control terminal of the fifth transistor is coupled to the third node, wherein the fifth transistor is selectively conducted according to the voltage of the third node.

5. The shift register circuit of claim 1, wherein the input circuit comprises:
a transistor, wherein the transistor comprises a first terminal, a second terminal and a control terminal, the first terminal of the transistor is configured to receive the first input signal, the second terminal of the transistor is coupled to the first node, and the control terminal of the transistor is configured to receive the first clock signal, wherein the transistor is selectively conducted according to the first clock signal.

6. The shift register circuit of claim 1, wherein the driving circuit comprises:
a first transistor, wherein the first transistor comprises a first terminal, a second terminal and a control terminal, the first terminal of the first transistor is configured to receive the second voltage, the second terminal of the first transistor is coupled to a fourth node, and the control terminal of the first transistor is configured to receive the first clock signal, wherein the first transistor is selectively conducted according to the first clock signal;
a second transistor, wherein the second transistor comprises a first terminal, a second terminal and a control terminal, the first terminal of the second transistor is coupled to the second terminal of the first transistor and the fourth node, the second terminal of the second transistor is configured to receive the first voltage, and the control terminal of the second transistor is configured to receive the second clock signal, wherein the second transistor is selectively conducted according to the second clock signal; and
a capacitor, wherein the capacitor comprises a first terminal and a second terminal, the first terminal of the capacitor is coupled to the fourth node, and the second terminal of the capacitor is coupled to the first node, wherein the driving circuit is configured to decrease the first voltage of the first node in response to the first clock signal and the second clock signal.

7. The shift register circuit of claim 1, wherein the pull-down circuit comprises:
a transistor, wherein the transistor comprises a first terminal, a second terminal and a control terminal, the first terminal of the transistor is configured to receive the first voltage, the second terminal of the transistor is coupled to the output terminal, and the control terminal of the transistor is configured to receive the first voltage of the first node, wherein the transistor is selectively conducted according to the first voltage of the first node.

8. A gate driver, comprising:
a plurality of shift register circuits as claimed in claim 1, wherein the plurality of shift register circuits are connected in series with each other, a first shift register circuit of the plurality of shift register circuits is configured to receive a first clock signal and a second clock signal, wherein the first shift register circuit adjusts a voltage of a first node of the first shift register circuit in response to the first clock signal and the second clock signal, and the first shift register circuit outputs a first voltage in response to the voltage of the first node; and
a second shift register circuit of the plurality of shift register circuits is configured to receive a third clock signal and a fourth clock signal, wherein the second shift register circuit adjusts a voltage of a second node of the second shift register circuit in response to the third clock signal and the fourth clock signal, and the second shift register circuit outputs a second voltage in response to the voltage of the second node,
wherein the first clock signal and the third clock signal are inverted, and the second clock signal and the fourth clock signal respectively generate a pulse signal during different periods.

9. The gate driver of claim 8, wherein the first shift register circuit operates in an input period, and the first clock signal is low level during the input period, wherein the first shift register circuit receives the first voltage, and stores the first voltage in the first node.

10. The gate driver of claim 8, wherein the first shift register circuit operates in a pull-up period, and the second clock signal is low level during the pull-up period, wherein the first shift register circuit outputs the second voltage, wherein the second voltage is higher than the first voltage.

11. The gate driver of claim 10, wherein one of the plurality of shift register circuits operates in a maintaining period, and one of the plurality of shift register circuits maintains operation of the pull-up period during the maintaining period.

12. The gate driver of claim 8, wherein the first shift register circuit operates in a pull-down period, the second clock signal is low level during the pull-down period, and the first shift register circuit inputs the first voltage to the first node.

13. The gate driver of claim 8, wherein the first shift register circuit operates in a stabilizing period, the second clock signal is low level and the first shift register circuit decreases the voltage of the first node during the stabilizing period, such that the first shift register circuit outputs the first voltage.

* * * * *